(12) United States Patent
McGuffin et al.

(10) Patent No.: US 7,139,986 B2
(45) Date of Patent: Nov. 21, 2006

(54) SYSTEMS AND METHODS FOR DETERMINING COSTS ASSOCIATED WITH A SELECTED OBJECTIVE

(75) Inventors: Tyson R. McGuffin, Fort Collins, CO (US); Thomas W. Chen, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 166 days.

(21) Appl. No.: 10/798,038

(22) Filed: Mar. 11, 2004

(65) Prior Publication Data

US 2005/0204320 A1     Sep. 15, 2005

(51) Int. Cl.
*G06F 17/50* (2006.01)
(52) U.S. Cl. .................... 716/2; 716/4; 716/5
(58) Field of Classification Search ............... 716/2, 716/4–5
See application file for complete search history.

(56) References Cited

U.S. PATENT DOCUMENTS

| | | | |
|---|---|---|---|
| 5,255,345 A | 10/1993 | Shaefer | |
| 5,970,487 A | 10/1999 | Shackleford et al. | |
| 6,088,519 A | 7/2000 | Koford | |
| 6,182,057 B1 | 1/2001 | Kikuchi et al. | |
| 6,493,658 B1 | 12/2002 | Koford et al. | |
| 6,557,145 B1 | 4/2003 | Boyle et al. | |
| 6,578,176 B1 | 6/2003 | Wang et al. | |
| 6,711,720 B1* | 3/2004 | Chen | 716/2 |
| 6,785,870 B1* | 8/2004 | Chen | 716/2 |
| 6,910,192 B1* | 6/2005 | McConaghy | 716/2 |
| 2003/0145289 A1* | 7/2003 | Anderson | 716/2 |

OTHER PUBLICATIONS

Barry Shackleford, et al., Synthesis of Minimum-Cost Multilevel Logic Networks via Genetic Algorithm, Sasimi 2000, Apr. 6-7, 2000.

* cited by examiner

*Primary Examiner*—Stacy A. Whitmore (57) ABSTRACT

Systems and methods associated with costs of a selected objective are disclosed. One embodiment of a system may comprise a constraint evaluator that evaluates a value set associated with a plurality of objectives to determine if a non-selected objective has violated at least one constraint. The system may further comprise a cost function configurable to evaluate a cost associated with the value set at a first cost range if the value set violates the at least one constraint associated with the non-selected objective, and to evaluate a cost associated with the value set at a second cost range associated with the selected objective if the value set does not violate the at least one constraint associated with the non-selected objective, such that the second cost range is different from the first cost range.

9 Claims, 7 Drawing Sheets

| CHROMOSOME | COST |
|---|---|
| CHROMOSOME A | 1023 |
| CHROMOSOME B | 1010 |
| CHROMOSOME C | 1009 |
| CHROMOSOME D | 1032 |

FIG. 5

| CHROMOSOME | COST |
|---|---|
| CHROMOSOME B | 1010 |
| CHROMOSOME C | 1009 |
| CHROMOSOME D | 54 |
| CHROMOSOME E | 42 |

FIG. 6

| CHROMOSOME | COST |
|---|---|
| CHROMOSOME D | 54 |
| CHROMOSOME E | 42 |
| CHROMOSOME F | 34 |
| CHROMOSOME G | 39 |

SYSTEMS AND METHODS FOR DETERMINING COSTS ASSOCIATED WITH A SELECTED OBJECTIVE

BACKGROUND

Genetic algorithms are application technologies inspired by mechanisms of inheritance and evolution of living things. In the evolution of living things, genomic changes like crossovers of chromosomes and mutations of genes can occur when new individuals (children) are born from old individuals (parents). In a genetic algorithm, a candidate of a solution to a problem is represented as a data structure, referred to as a chromosome. The data structure represents a plurality of variables or bits referred to as genes. A plurality of n-bit parent chromosomes can be generated and assigned a fitness based on an evaluation of a fitness function. In certain applications, fitness corresponds to a cost associated with a chromosome with a lower cost being more fit than chromosomes with higher costs. Chromosomes with lower costs can be selected for generating new children chromosomes. Children chromosomes are generated through a process of crossover and mutation of parent chromosomes to produce new child chromosomes. Child chromosomes with lower costs or better fitness replace members of the population with higher costs or less fit chromosomes to assure evolutionary advance to an optimal solution.

In the context of circuit optimization, multiple objectives may need to be optimized. Therefore, a multi-objective cost function is employed to combine objectives to produce an associated cost for a given circuit solution. However, if certain constraints associated with a given objective override other constraints associated with other objectives, the multi-objective cost function is not suitable, since weighting coefficients associated with one constraint can override weighting coefficients of other constraints effectively eliminating objectives from the cost function.

SUMMARY

One embodiment of the present invention may comprise a system for determining a cost associated with a selected objective from a plurality of objectives. The system may comprise a constraint evaluator that evaluates a value set associated with a plurality of objectives to determine if a non-selected objective has violated at least one constraint. The system may further comprise a cost function configurable to evaluate a cost associated with the value set at a first cost range if the value set violates the at least one constraint associated with the non-selected objective, and to evaluate a cost associated with the value set at a second cost range associated with the selected objective if the value set does not violate the at least one constraint associated with the non-selected objective, such that the second cost range is different from the first cost range.

Another embodiment may comprise a system for selecting a value set based on a cost associated with a selected objective. The system may comprise a first cost function that evaluates costs of a value set associated with a non-selected objective if the value set does not meet at least one constraint associated with the non-selected objective, and a second cost function that evaluates costs of the value set associated with the selected objective if the value set does meet the at least one constraint associated with the non-selected objective. The system may further comprise a genetic algorithm that selects chromosomes with lower costs from chromosomes created from value sets and associated costs evaluated by the first and second cost functions to generate value set variations.

Yet another embodiment of the present invention may relate to a system for minimizing a cost associated with a selected objective from a multi-objective cost function. The system may comprise means for generating parameters associated with the selected objective and a non-selected objective from a value set, means for determining if parameters associated with the non-selected objective meet at least one non-selected objective constraint, and means for configuring a multi-objective cost function to evaluate costs at a first cost range if parameters associated with the non-selected objective do not meet the at least one non-selected objective constraint and evaluating costs at a second cost range if parameters associated with the non-selected objective do meet the at least one non-selected objective constraint.

Still another embodiment is related to a method for determining a cost associated with a selected objective from a plurality of objectives. The method may comprise generating a cost for a value set based on a non-selected objective if the value set does not meet constraints associated with the non-selected objective, and on the selected objective if the value set does meet constraints associated with the non-selected objective. The method may further comprise generating at least one value set variation based on value sets with lower costs, and repeating the generating of a cost based on one of the non-selected objective and the selected objective for the at least one value set variation.

Still another embodiment of the invention may comprise a computer readable medium having computer executable instructions for performing a method. The method may comprise generating a first set of parameters associated with a non-selected objective and a second set of parameters associated with a selected objective, the first and second set of parameters being based on a value set. The method may further comprise generating costs at a first cost range based on the first set of parameters if the first set of parameters do not meet constraints associated with the non-selected objective, and generating costs at a second cost range based on the second set of parameters if the first set of parameters do meet constraints associated with the non-selected objective. The first cost range may be substantially higher than the second cost range.

DETAILED DESCRIPTION

This disclosure relates generally to systems and methods for providing a cost associated with an objective selected from a plurality of objectives. A cost for a given objective can be associated with one or more parameters associated with or derived from a value set. Costs associated with a non-selected objective are assigned a cost range in the event that parameters associated with the non-selected objective violate one or more constraints. The selective objective is associated with a cost range that is different than the cost range of the non-selected objective. If a parameter(s) associated with a non-selected objective violates at least one constraint, costs are evaluated at the cost range associated with the non-selected objective. If a parameter(s) associated with a non-selected objective does not violate at least one constraint, costs are evaluated at the cost range associated with the selected objective. A genetic algorithm can be employed to generate value set variations from lower cost value sets, until a desirable value set solution is achieved.

Figure 1:
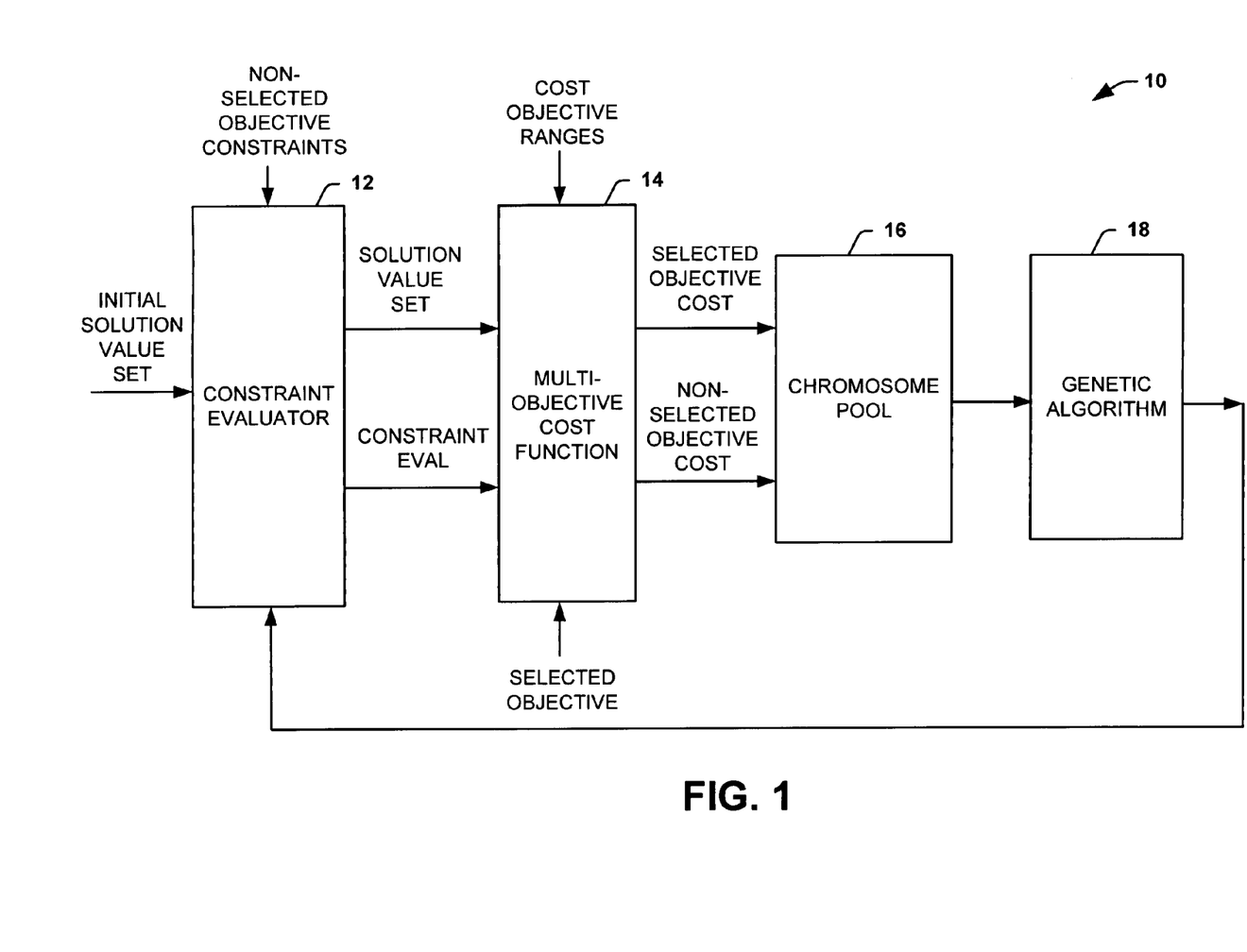
FIG. 1 illustrates an embodiment of a system for determining a cost associated with a selected objective from a plurality of objectives.

FIG. 1 illustrates a system 10 for determining a cost associated with a selected objective from a plurality of objectives. The system 10 can be a computer, a server or some other computer readable medium that can execute computer readable instructions. For example, the components of the system 10 can be computer executable components, such as can be stored in a desired storage medium (e.g., random access memory, a hard disk drive, CD ROM, and the like), computer executable components running on a computer or design tool. The system 10 employs an initial value set that can be characterized as a set of parameters. The set of parameters can define properties or attributes associated with an optimizable function or structure.

An optimizable function or structure refers to a solution that can be improved with adjustment of values associated with one or more parameters to achieve a desirable acceptable solution. The optimizable function or structure can be, for example, a circuit design, a mathematical problem or some other optimizable function or structure. Each value set associated with the set of parameters represents a potential solution to the optimizable function or structure. The system 10 selects a value set based on a desired fitness value or desired minimal cost associated with a selected objective. A change in value in any one of the parameters defines a new value set. Each value set can be represented by a chromosome, with each parameter representing a gene in the chromosome. Each value set can be evaluated to determine an associated cost with respect to a respective value set.

The system 10 includes a multi-objective cost function 14 that is configurable to evaluate a cost for a given value set based on a selected objective from a plurality of objectives, as long as the given value set does not violate constraints associated with at least one non-selected objective. If the given value set violates constraints associated with the at least one non-selected objective, the cost function will evaluate the cost based on a cost range that is different than the cost range associated with the selected objective. This allows algorithms (e.g., genetic algorithms) to readily discern between costs associated with the selected objective in which constraints are met for the non-selected objectives, and costs associated with non-selected objectives in which constrains are not met for the non-selected objectives.

The system 10 includes a constraint evaluator 12. The constraint evaluator 12 receives an initial value set and one or more non-selected objective constraints. The constraint evaluator 12 determines if a value set has or has not met predetermined constraints associated with a respective non-selected objective based on the value set and the non-selected objective constraints provided to the constraint evaluator 12. The value sets can be parameterized into parameters associated with one or more objectives. These parameters can be evaluated to determine if desired constraints have been met.

The constraint evaluator 12 then provides the value set solution and/or parameters to the multi-objective cost function 14. The multi-objective cost function 14 receives a selected objective from a plurality of objectives associated with the solution value set and one or more objective cost ranges. The multi-objective cost function 14 is configured to evaluate a cost associated with the value set at a non-selected objective cost range if the value set violates at least one constraint associated with a non-selected objective. The multi-objective cost function 14 is configured to evaluate a cost associated with the value set at a selected objective cost range if the value set does no violate at least one constraint associated with a non-selected objective. The selected objective cost range is different than the non-selected cost range. For example, the selected objective cost range can be substantially lower than the non-selected objective cost range, such that a cost associated with the selected objective cost range is readily discernible from the non-selected cost range in which constraints have not been met.

It is to be appreciated that more than one non-selected objective cost range can be employed if constraints are evaluated for more than one non-selected objective. For example, a first objective cost range can be employed if a first non-selected objective does not meet objective constraints and a second objective cost range can be employed if a second non-selected objective does not meet objective constraints. Alternatively, a first objective cost range can be employed if a first and a second non-selected objective do not meet objective constraints and a second objective cost range can be employed if one of the first and second non-selected objectives does meet objective constraints, and the other does not.

The multi-objective cost function 14 generates costs at a non-selected objective cost range for value sets that violate at least one constraint associated with a non-selected objective. The multi-objective cost function 14 generates costs at a selected objective cost range for value sets that do not violate at least one constraint associated with a non-selected objective. The value set and its associated costs form a chromosome. The value sets and associated costs are stored in a chromosome pool 16 as chromosomes. The chromosome pool 16 is a data structure (e.g., a table, a list, a data base, etc.) that maintains the chromosomes (e.g., value sets or parameters) and associated costs, or references (e.g., pointers) to the chromosomes and associated costs in memory. The chromosomes can be ranked or ordered in the chromosome pool 16 based on minimum costs associated with respective chromosomes. The chromosome pool 16 can include a set number of chromosomes, such that chromosomes having costs exceeding a predetermined minimum cost level are discarded from the chromosome pool 16.

The chromosomes from the chromosome pool 16 are employed by a genetic algorithm 18 to generate children chromosomes associated with parent chromosomes selected from the chromosome pool 16. The genetic algorithm 18 can select parent chromosomes based on chromosomes with lower costs. The children chromosomes are generated through a process of crossover and mutation of parent chromosomes. The genetic algorithm 18 can generate one or more generations of chromosomes or value set variations based on selecting parent chromosomes from the chromosome pool 18. The children chromosomes or value set variations generated by the genetic algorithm 18 are provided to the constraint evaluator 12. The constraint evaluator 12 then evaluates the children chromosomes or value set variations to determine if constraints associated with the non-selected objectives have been violated. A solution value set associated with a respective child chromosome and constraint evaluation information are provided to the multi-objective cost function 14.

The multi-objective cost function 14 then evaluates the associated costs for one or more value set variations generated by the genetic algorithm at the non-selected objective cost range if constraints are not met for one or more non-selected objectives, or evaluates costs for one or more value set variations at the selected objective cost range if constraints are met for the non-selected objectives. This process can be repeated for subsequent generations, until costs are evaluated in the selective objective cost range. Once costs are evaluated in the selective objective cost range, a determination of whether a desirable solution has been achieved is performed. The desirable solution can be based on achieving a minimum cost associated with a chromosome or when costs converge. If the desirable solution has not been achieved, subsequent generations of chromosomes can be generated and evaluated until a desirable solution has been determined.

Figure 2:
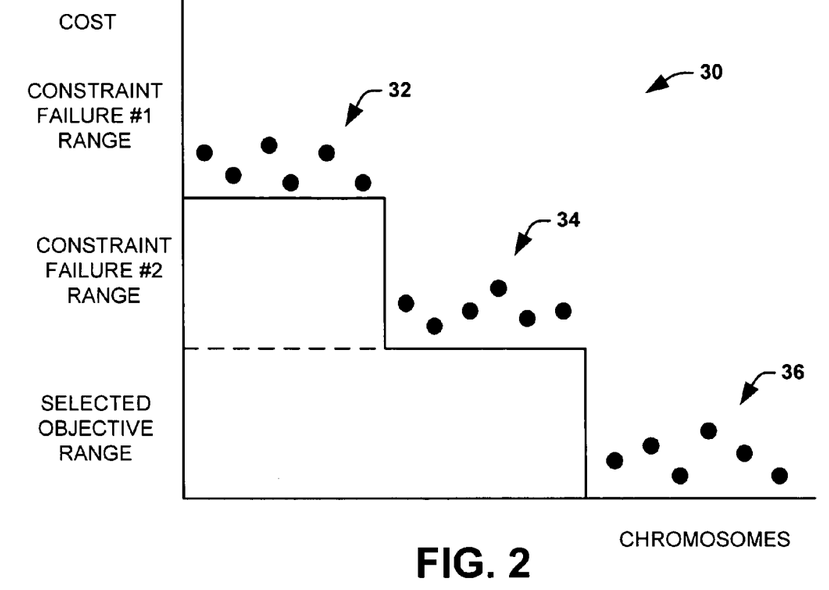
FIG. 2 illustrates an embodiment of a graph of cost versus chromosomes.

FIG. 2 illustrates a graph 30 of cost versus chromosomes. The graph 30 illustrated costs associated with chromosomes of a multiple objective cost function that employs multiple ranges to readily discern between a selected objective and failure of constraints associated with a non-selected objective. The graph 30 illustrates a first constraint failure range and a second constraint failure range. The first constraint failure range can illustrate costs associated with chromosomes 32 that fail constraints associated with a first non-selected objective. Alternatively, the first constraint failure range can illustrate costs associated with chromosomes that fail constraints associated with two or more non-selected objectives. A genetic algorithm will generate children from chromosomes in the first constraint failure range, until the new chromosomes pass constraints associated with the first constraint failure range.

For example, a factor K (e.g., 10,000) can be added or multiplied to costs associated with a first non-selected objective that maintains costs in the first constraint failure range until new generated chromosomes pass constraints associated with the first non-selected objective. Once chromosomes pass constraints associated with the first non-selected objective, the costs of the chromosomes can be evaluated at the second constraint failure range for chromosomes 34 that pass the first non-selected objective, but fail a second non-selected objective. A factor N (e.g., 1000), where K is substantially greater than N, can be added or multiplied to costs associated with the second non-selected objective to maintains costs in the second constraint failure range, until chromosomes pass constraints associated with the first and the second non-selected objectives. Once chromosomes pass constraints associated with the first and the second non-selected objectives, the costs of chromosomes 36 can be evaluated at a selected objective cost range.

A genetic algorithm will generate children from chromosomes 36 in the selected objective cost range, until a desired solution is achieved. In this manner, costs are based on a selected objective as long as constraints have been met for one or more non-selected objectives. By making the cost range for the first constraint failure range substantially greater than the cost range of the second constraint failure range, and the cost range of the second constraint failure range substantially greater than the cost range of the selected objective cost range, the genetic algorithm can readily discern and select chromosomes with lower costs to provide a solution that readily converges based on the desired selected objective.

Figure 3:
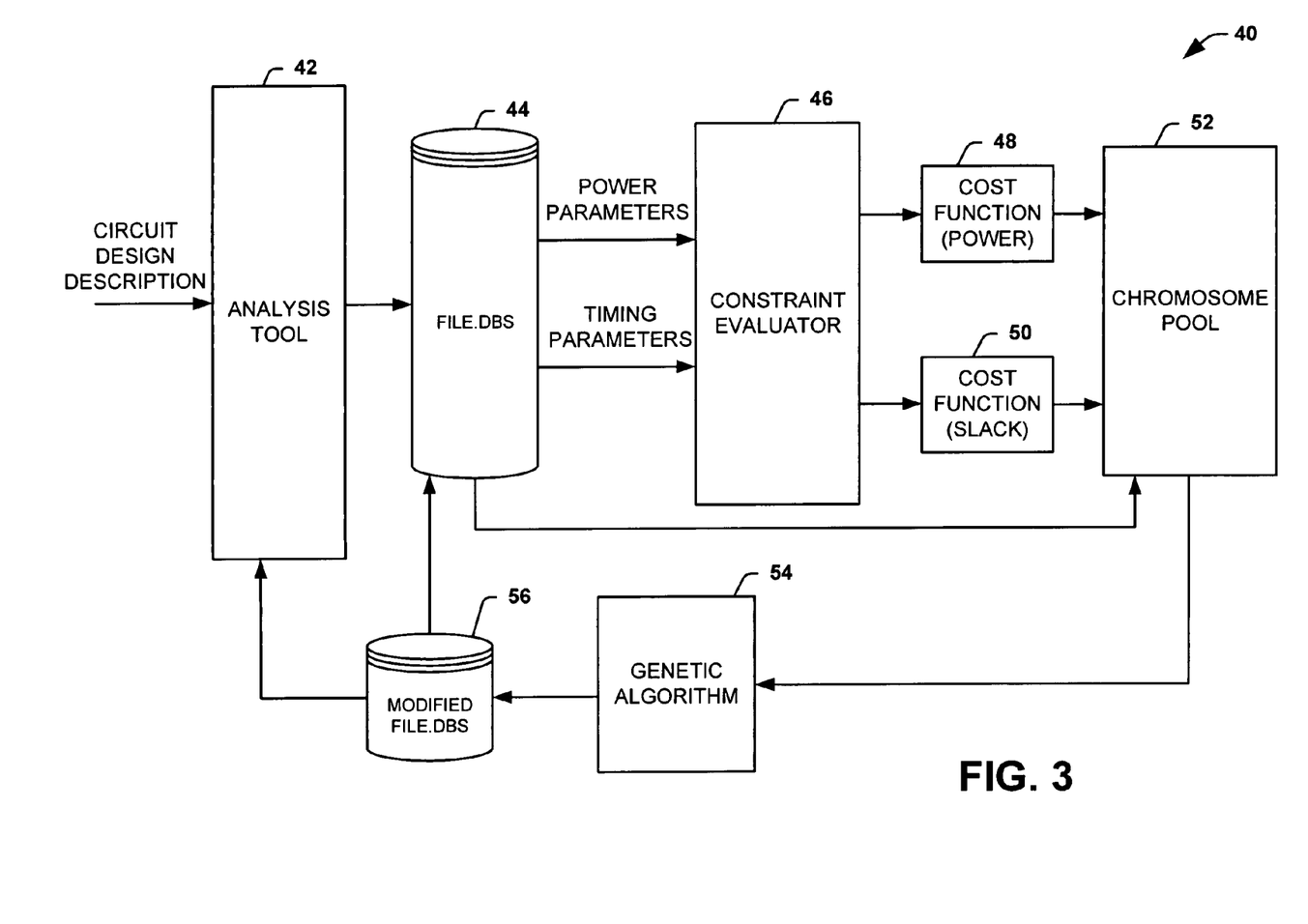
FIG. 3 illustrates an embodiment of a system for optimizing a circuit design based on a selected objective.

FIG. 3 illustrates a system 40 for optimizing a circuit design based on a selected objective. The system 40 includes power as a selected objective for optimization with timing being associated with a non-selected objective. Therefore, the system 40 is operative to optimize the circuit design based on power as long as timing constraints are met. In the system 40, timing constraints are associated with certain timing information known as slack. Slack generally corresponds to a measure of the difference between the expected arrival time and the actual arrival time of a signal at a point of a given path. For example, a positive slack number usually identifies by how much time a timing constraint has been met, whereas a negative slack number identifies an amount by which the timing constraint has been violated. It is to be appreciated that several other non-selected objectives can be associated with the circuit design.

The system 40 employs a circuit design description to provide information to an analysis tool 42. The design description can include transistor netlists, design netlists, design parasitic data and timing constraints associated with the circuit design. The analysis tool 42 can execute a device modification and timing algorithm to optimize a circuit design. For example, the analysis tool 42 can be a static timing analysis tool (e.g., PATHMILL® by Synopsys) for block and chip timing verification. A static timing analysis tool will generate a plurality of circuit design configurations that correspond to device changes (e.g., transistor sizing, cell device modifications) based on timing and delay analysis to optimize the circuit design based on speed, power and area.

Alternatively, the analysis tool 42 can be a transistor autosizer (e.g., AMPS® by Synopsys). Most transistor autosizers rely on heuristic approaches that focus on finding the best combination that will meet user-defined power and speed goals without changing the functionality of the design. The transistor autosizers employ an original circuit design description to generate a plurality of circuit sizing configurations that define different optimized cell netlist configurations.

The analysis tool 42 performs timing analysis, transistor sizing optimization, device modifications and/or power analysis on the circuit design description. The analysis tool 42 executes timing analysis and modifies transistor sizes and/or circuit cell configurations to optimize the circuit design. The analysis tool 42 generates power parameters and timing parameters via one or more file data bases (File.DB (s)). Each of the one or more file data bases 44 defines a circuit configuration, and a potential circuit design solution. Each circuit configuration or file data base 44 and its associated cost can be represented as a chromosome. The chromosomes are stored in a chromosome pool 52. Any change in the circuit design parameter values (e.g., device width, device length, circuit types, cell types) defines a new chromosome associated with the circuit design.

The information associated with the one or more file data bases 44 is provided to a constraint evaluator 46 as power and timing parameters. The constraint evaluator 46 determines if slack constraints have been met based on one or more timing parameters. If slack constraints have not been met, cost is based on a slack cost function 50. If slack constraints have been met, cost is based on a power cost function 48. The slack cost function 50 evaluates cost at a cost range that is substantially higher than the cost range in which the power cost function 48 evaluates costs.

For example, the slack cost function 50 can determine costs by evaluating the following equation:

$$\text{Cost}=M+1000*(\text{Slack}_{Actual}-\text{Slack}_{Max}) \quad \text{EQ.1}$$

where M (e.g., 1,000, 10,000) is a constant substantially greater than one, $\text{Slack}_{Actual}$ is the actual slack associated with a given circuit cell block, and $\text{Slack}_{Max}$ is the actually allowable Slack for the given circuit cell block to pass slack constraints. As long as $\text{Slack}_{Actual} > \text{Slack}_{Max}$ the circuit design fails constraints associated with the slack of the cell block, and costs are evaluated employing EQ. 1. The slack difference ($\text{Slack}_{Actual}-\text{Slack}_{Max}$) is employed in the equation so that the genetic algorithm can select parent chromosomes from lower cost chromosomes that are closer to meeting slack constraints.

As chromosomes are generated where $\text{Slack}_{Actual} < \text{Slack}_{Max}$, the circuit design passes constraints associated with the slack of the cell block. Costs for chromosomes that pass constraints are evaluated by the following equation:

$$\text{Cost}=\text{Power} \quad \text{EQ.2}$$

where power can be evaluated by a number of different methodologies based on a particular implementation. For example, power can be estimated by employing power consumption characterizations associated with switching power related parameters (e.g., switching capacitance, crossover current) and leakage power related parameters (e.g., tunneling leakage, source-to-drain leakage). Alternatively, power can be estimated based on a predetermined correlation that characterizes device power as a function of transistor area or transistor gate area. It is to be appreciate that a number of different power estimation techniques can be employed to determine power associated with a given circuit design configuration.

Circuit design configurations and associated costs are stored in the chromosome pool 52. A genetic algorithm 54 selects parents from the chromosome pool based on chromosomes that have the lowest costs. The genetic algorithm 54 generates children chromosomes as modified file data bases 56 (File.DB(s)) through a process of crossover and mutation of parent chromosomes selected from the file data bases 44 and associated costs. The modified file data bases 56 are stored into the file data bases 44. Alternatively, the modified file data bases 56 can be employed to generate a new circuit design that can be analyzed by the analysis tool 42. The constraint evaluator 46 extracts power parameters and timing parameters from the modified file data bases 56 to determine if the modified file data bases 56 and associated modified circuit design has passed slack constraints. Since the genetic algorithm 54 extracts lower cost chromosomes as parents, the genetic algorithm 54 can readily discern between costs generated by the slack cost function for chromosomes that fail slack constraints with costs generated by the power cost function for chromosomes that pass slack constraints. The genetic algorithm 54 eventually selects parents from chromosomes that pass slack constraints and provides a desirable solution based on minimum power.

Figure 4:
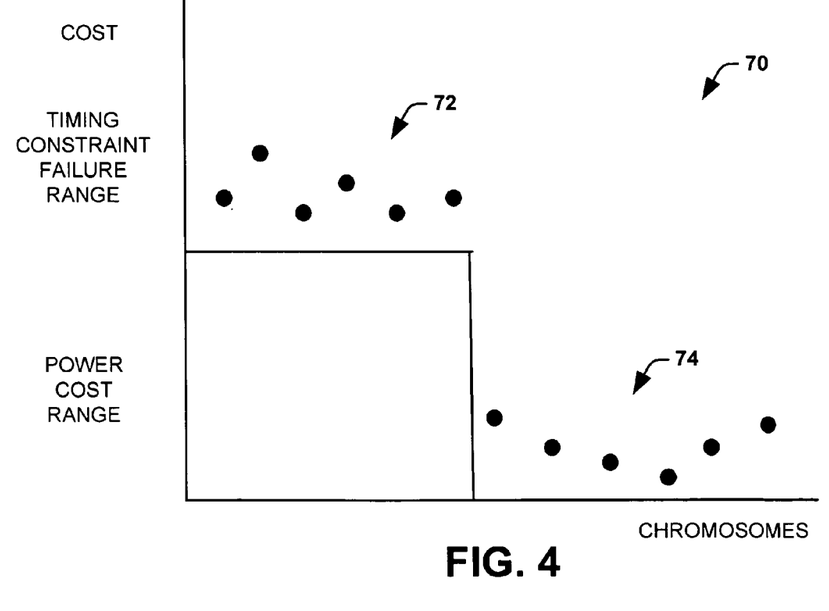
FIG. 4 illustrates another embodiment of a graph of cost versus chromosomes.

FIG. 4 illustrates a graph 70 of cost versus chromosomes. The graph 70 illustrates costs associated with chromosomes of a cost function that employs multiple ranges to readily discern between circuit power as a selected objective and failure of constraints associated with timing parameters (e.g., slack) as a non-selected objective. The graph 70 illustrates a timing constraint failure range and a power cost range. The timing constraint failure range illustrates costs associated with chromosomes 72 that fail timing constraints for one or more cell blocks. A genetic algorithm will generate children having lower costs from chromosomes 72 in the timing constraint failure range, until the new children chromosomes 74 pass constraints associated with the timing constraint failure range.

For example, a factor M (e.g., 1,000, 10,000) can be added or multiplied to costs associated with the timing objective (e.g., $\text{Slack}_{Actual}-\text{Slack}_{Max}$) that maintains costs in the timing constraint failure range until chromosomes pass timing constraints associated with one or more cell blocks of a circuit design. Once chromosomes pass constraints associated with the timing of one or more cell blocks of the circuit design, the costs of the chromosomes 74 can be evaluated at the power cost range. A genetic algorithm will then generate children from chromosomes 74 in the power cost range, until a desired solution is achieved. In this manner, costs are based on power as a selected objective as long as timing constraints associated with the circuit design have been met. By making the cost range for the timing constraint failure range substantially greater than the power cost range, the genetic algorithm can readily discern and select chromosomes with lower costs to provide a solution that readily converges based on power as the desired selected objective.

Figure 5:
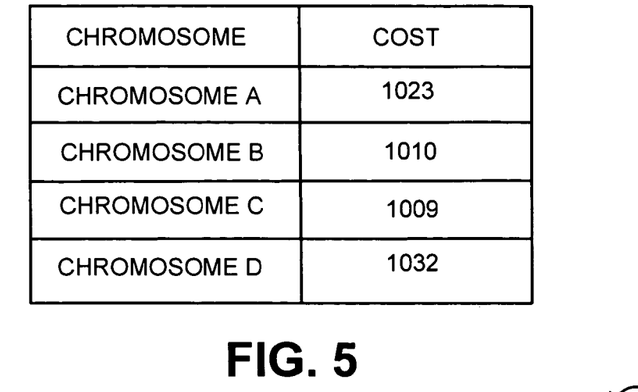
FIG. 5 illustrates an embodiment of a chromosome pool with chromosomes in a timing constraint failure range.
Figure 6:
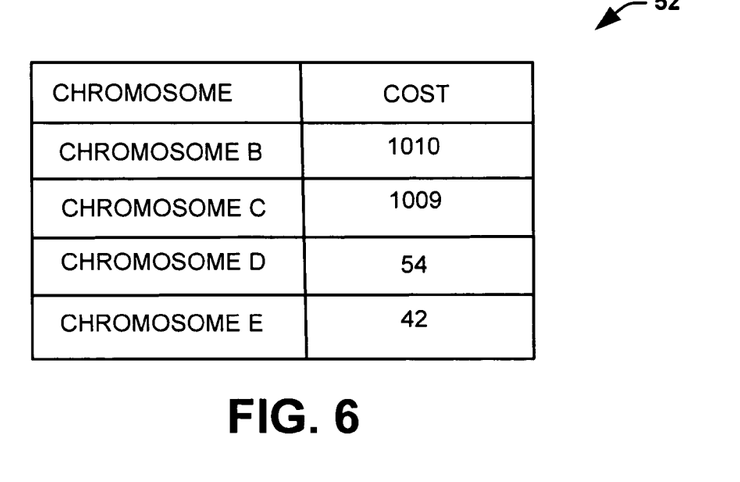
FIG. 6 illustrates an embodiment of a chromosome pool with chromosomes in a timing constraint failure range and a power cost range.
Figure 7:
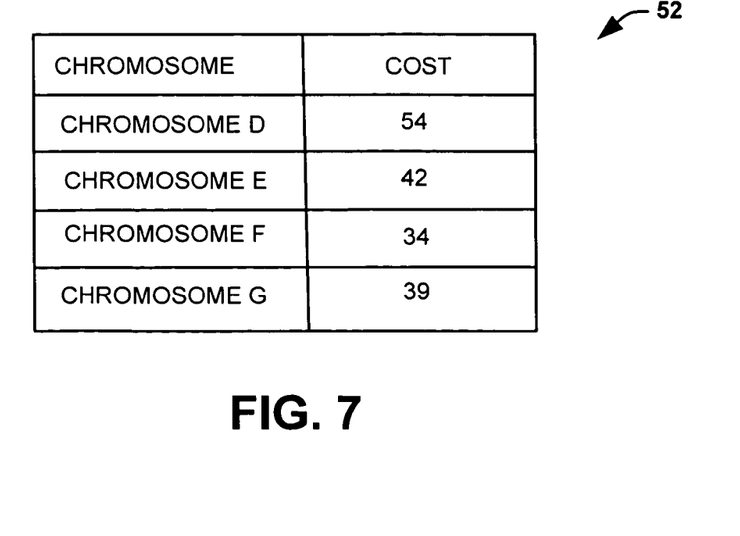
FIG. 7 illustrates an embodiment of a chromosome pool with chromosomes in a power cost range.

FIGS. 5–7 illustrate contents of the chromosome pool 52 of the system 40 of FIG. 3 over a plurality of genetic algorithm iterations. In the illustrated example of FIGS. 5–7, the chromosome pool 52 retains four chromosomes with the lowest costs. It is to be appreciated that in an actual implementation, the chromosome pool 52 can retain thousands of chromosomes with or without retaining a set number of chromosomes.

FIG. 5 illustrates the chromosome pool 52 with chromosomes in the timing constraint failure range. The chromosomes pool 52 includes chromosome A with a cost of 1023, chromosome B with a cost of 1010, chromosomes C with a cost of 1009 and chromosome D with a cost of 1032. Each chromosome A–D has failed timing constraints (e.g., slack constraints) associated with at least one block in the circuit design. Therefore, costs are evaluated employing EQ. 1 based on the difference between the actual slack and the maximum allowable slack plus a substantially high constant (1,000).

FIG. 6 illustrates the chromosome pool 52 with chromosomes in the timing constraint failure range and the power cost range. The genetic algorithm 54 has selected chromosomes B and C as parents and generated children chromosomes D and E. Children chromosome D and E have passed timing constraints (e.g., slack constraints) associated with at least one block in the circuit design. Therefore, costs for chromosome D and E are evaluated employing EQ. 2 based on the power consumption of the circuit design. Power can be evaluated employing a variety of different power estimation techniques based on a particular implementation.

FIG. 7 illustrates the chromosome pool 52 with chromosomes in the power cost range. The genetic algorithm 54 can readily discern between lower cost chromosomes D and E, which pass timing constraints, and chromosomes B and C which do not pass timing constraints. The genetic algorithm 54 selects chromosomes D and E as parents and generates children chromosomes F and G, which have lower cost than parent chromosomes D and E. Children chromosome F and G have passed timing constraints (e.g., slack constraints) associated with the circuit design. Therefore, costs for chromosome F and G are evaluated employing EQ. 2 based on the power consumption of the circuit design. This process can be repeated employing parent selected from chromosomes with lower costs that have passed timing constraints, until costs converge or a desirable solution has been achieved.

Figure 8:
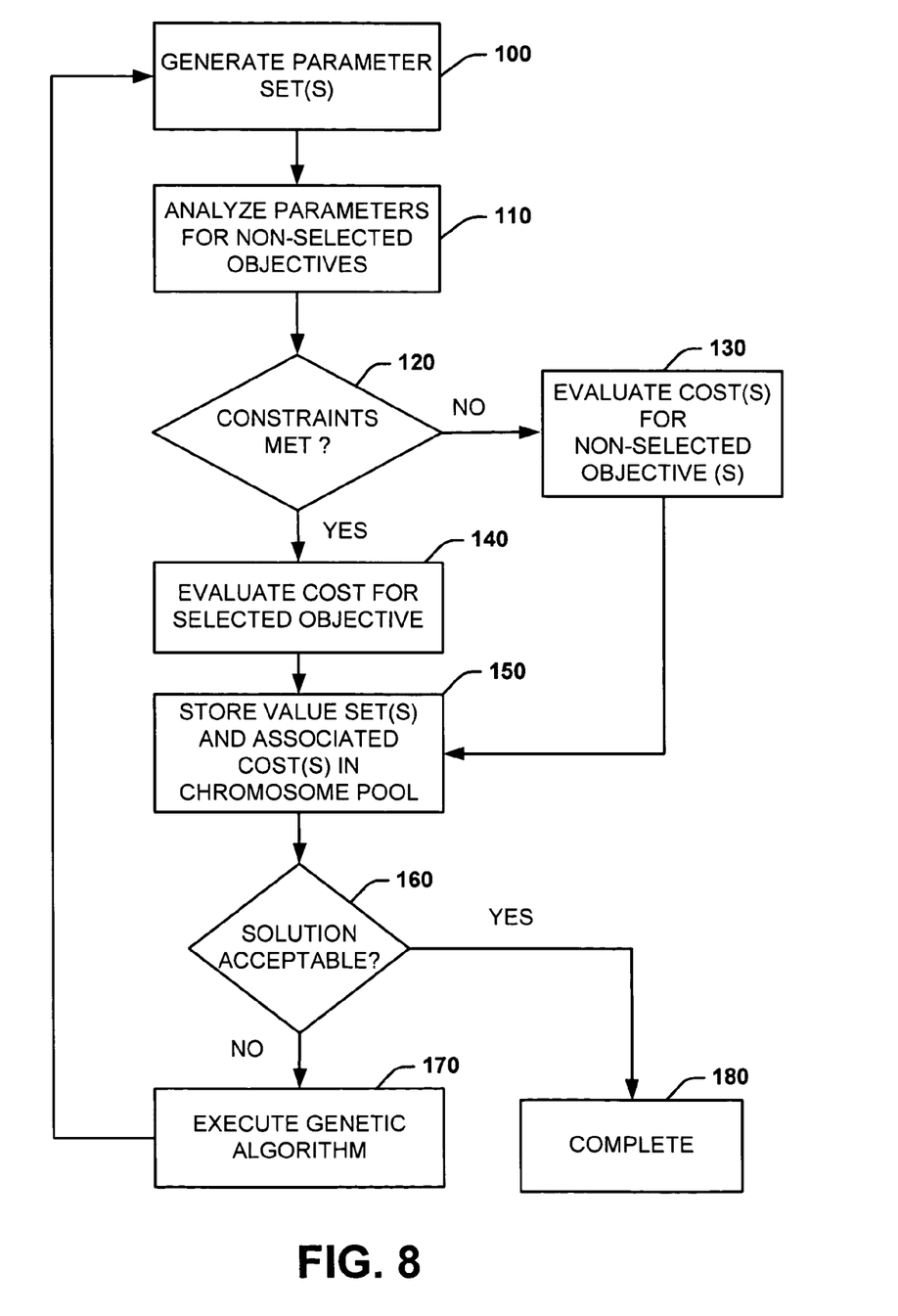
FIG. 8 illustrates an embodiment of a method for determining a cost associated with a selected objective from a plurality of objectives.
Figure 9:
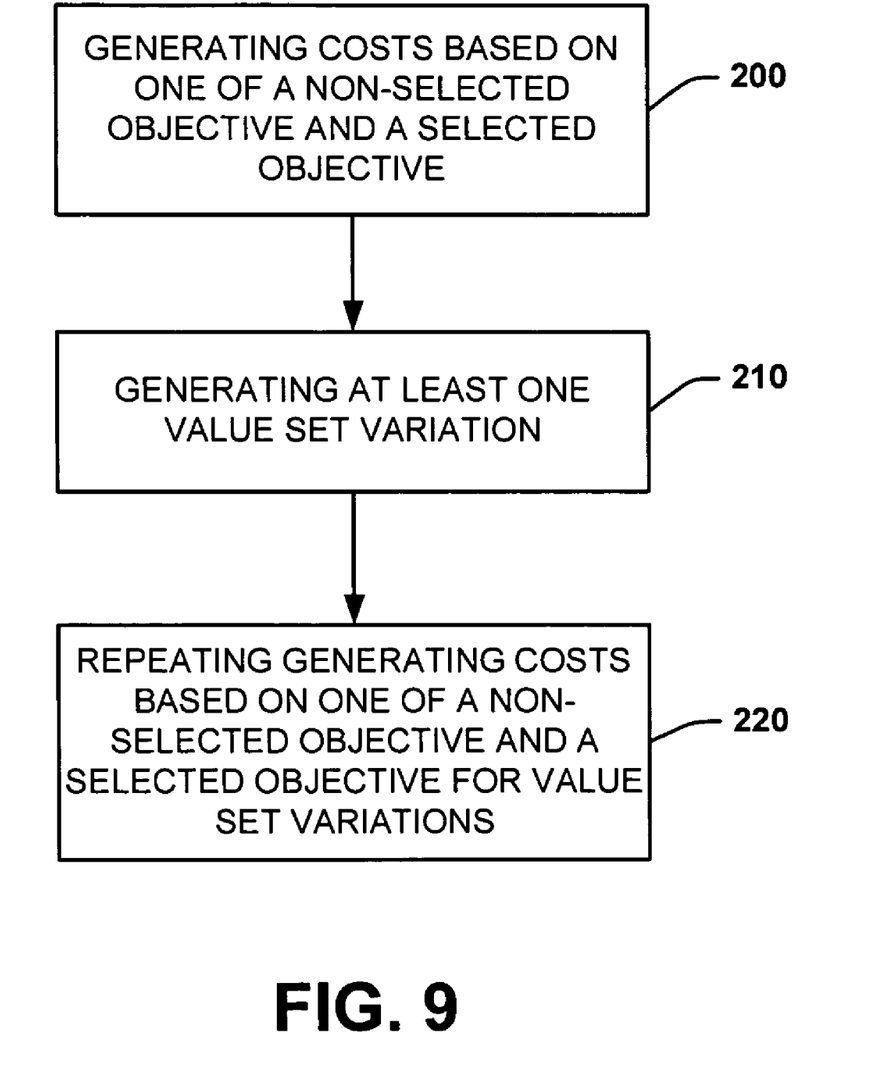
FIG. 9 illustrates another embodiment of a method for determining a cost associated with a selected objective from a plurality of objectives.

In view of the foregoing structural and functional features described above, certain methods will be better appreciated with reference to FIGS. 8–9. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., as one or more integrated circuits or circuit boards containing a plurality of microprocessors), software (e.g., as executable instructions running on one or more processors), or any combination thereof.

FIG. 8 illustrates a method for determining a cost associated with a selected objective from a plurality of objectives. The methodology begins at 100 where parameters are generated for a value set associated with a multiple objective cost function. At 110, parameters associated with one or more non-selected objectives selected or derived from at least a portion of the value set are analyzed. At 120, the methodology determines if the parameters associated with the one or more non-selected objectives have met constraints. If the parameters associated with the non-selected objective have not met constraints (NO), the methodology proceeds to 130. At 130, costs are evaluated for the one or more non-selected objectives. For example, costs for the one or more non-selected objectives are evaluated at a cost range that is substantially higher than the cost range of a selected objective. This allows a genetic algorithm to readily discern between costs associated with the selected objective and the one or more non-selected objectives. Additionally, one or more cost range tiers can be employed for the one or more non-selected objectives. The value sets and associated costs are then stored as chromosomes in a chromosome pool at 150.

If the parameters associated with the non-selected objective have met constraints (YES) at 120, the methodology proceeds to 140. At 140, costs are evaluated for the selected objective based on parameters associated with the selected objective selected or derived from at least a portion of the value set. These parameters can be the same or different than the parameters associated with the one or more non-selected objectives. The costs for the selected objective are evaluated at a cost range that is substantially lower than the cost range for the one or more non-selected objective. The value sets and associated costs associated with the selected objective are then stored as chromosomes in the chromosome pool at 150. The methodology then proceeds to 160.

At 160, the methodology determines if a desirable value set solution resides in the chromosome pool. If a desirable solution resides in the chromosome pool (YES), the methodology completes at 180. If a desirable solution does not reside in the chromosome pool (NO), the methodology proceeds to 170. At 170, a genetic algorithm selects parent chromosomes from the chromosome pool based on minimum costs. The genetic algorithm then generates new value sets or value set variations from the selected parent chromosomes. The methodology then returns to 100 to generate parameters from the new value sets, which are assigned costs in the non-selected objective cost range or selected objective cost range depending on whether or not the parameters associated with the value set pass criteria associated with the non-selected objective. Since the costs for the non-selected objectives are in a cost range substantially higher than the cost range of the selected objective, the genetic algorithm can readily discern between costs for non-selected objectives and the selected objective, which facilitates convergence to a solution associated with the selected objective.

FIG. 9 illustrates an alternate methodology for determining a cost associated with a selected objective from a plurality of objectives. At 200, cost are generated for a value set based on a non-selected objective if the value set does not meet constraints associated with the non-selected objective and on a selected objective if the value set does meet constraints associated with the non-selected objective. At 210, at least one value set variation is generated based on value sets with lower costs. At 220, the generating of a cost based on one of the non-selected objective and the selected objective is repeated for the at least one value set variation.

Figure 10:
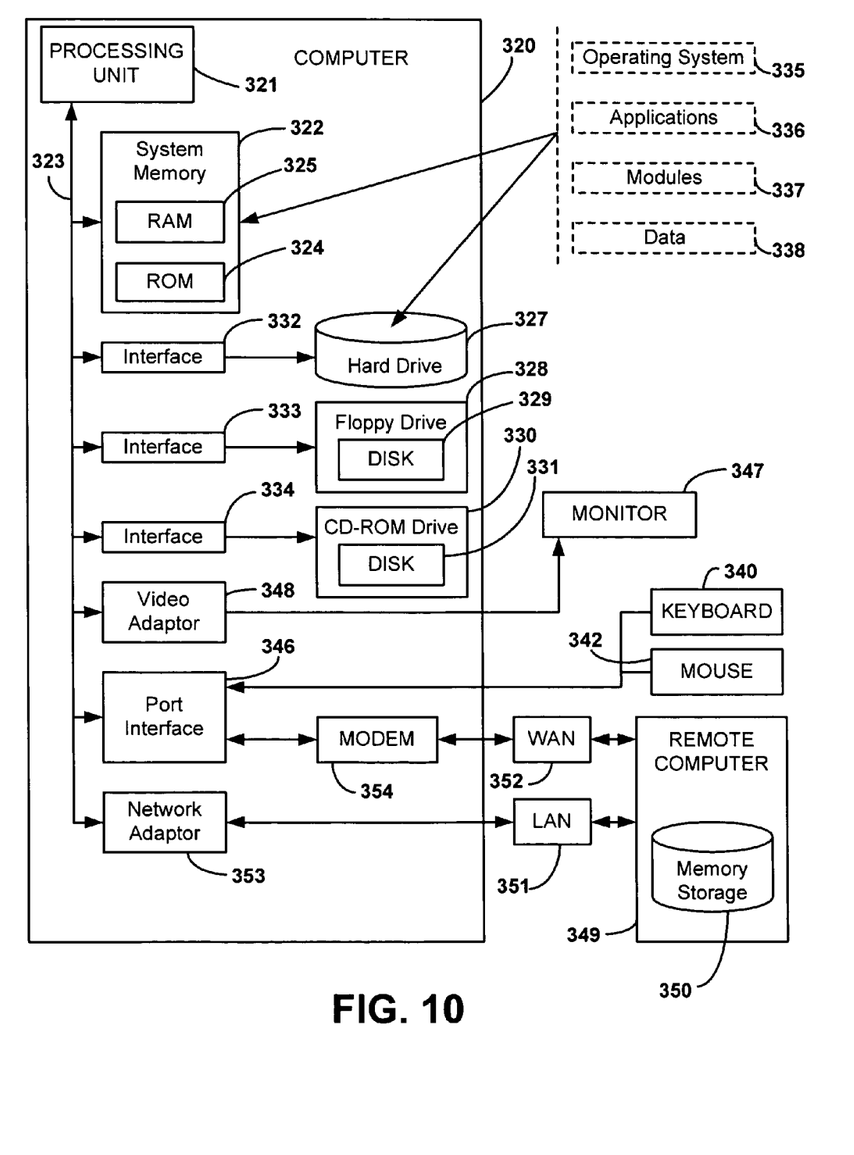
FIG. 10 illustrates an embodiment of a computer system.

FIG. 10 illustrates a computer system 320 that can be employed to execute one or more embodiments employing computer executable instructions. The computer system 320 can be implemented on one or more general purpose networked computer systems, embedded computer systems, routers, switches, server devices, client devices, various intermediate devices/nodes and/or stand alone computer systems. Additionally, the computer system 320 can be implemented on various mobile clients such as, for example, a cell phone, personal digital assistant (PDA), laptop computer, pager, and the like.

The computer system 320 includes a processing unit 321, a system memory 322, and a system bus 323 that couples various system components including the system memory to the processing unit 321. Dual microprocessors and other multi-processor architectures also can be used as the processing unit 321. The system bus may be any of several types of bus structure including a memory bus or memory controller, a peripheral bus, and a local bus using any of a variety of bus architectures. The system memory includes read only memory (ROM) 324 and random access memory (RAM) 325. A basic input/output system (BIOS) can reside in memory containing the basic routines that help to transfer information between elements within the computer system 320.

The computer system 320 can includes a hard disk drive 327, a magnetic disk drive 328, e.g., to read from or write to a removable disk 329, and an optical disk drive 330, e.g., for reading a CD-ROM disk 331 or to read from or write to other optical media. The hard disk drive 327, magnetic disk drive 328, and optical disk drive 330 are connected to the system bus 323 by a hard disk drive interface 332, a magnetic disk drive interface 333, and an optical drive interface 334, respectively. The drives and their associated computer-readable media provide nonvolatile storage of data, data structures, and computer-executable instructions for the computer system 320. Although the description of computer-readable media above refers to a hard disk, a removable magnetic disk and a CD, other types of media which are readable by a computer, such as magnetic cassettes, flash memory cards, digital video disks and the like, may also be used in the operating environment, and further that any such media may contain computer-executable instructions.

A number of program modules may be stored in the drives and RAM 325, including an operating system 335, one or more application programs 336, other program modules 337, and program data 338. A user may enter commands and information into the computer system 320 through a keyboard 340 and a pointing device, such as a mouse 342. Other input devices (not shown) may include a microphone, a joystick, a game pad, a scanner, or the like. These and other input devices are often connected to the processing unit 321 through a corresponding port interface 346 that is coupled to the system bus, but may be connected by other interfaces, such as a parallel port, a serial port or a universal serial bus (USB). A monitor 347 or other type of display device is also connected to the system bus 323 via an interface, such as a video adapter 348.

The computer system 320 may operate in a networked environment using logical connections to one or more remote computers, such as a remote client computer 349. The remote computer 349 may be a workstation, a computer system, a router, a peer device or other common network node, and typically includes many or all of the elements described relative to the computer system 320. The logical connections can include a local area network (LAN) 351 and a wide area network (WAN) 352.

When used in a LAN networking environment, the computer system 320 can be connected to the local network 351 through a network interface or adapter 353. When used in a WAN networking environment, the computer system 320 can include a modem 354, or can be connected to a communications server on the LAN. The modem 354, which may be internal or external, is connected to the system bus 323 via the port interface 346. In a networked environment, program modules depicted relative to the computer system 320, or portions thereof, may be stored in the remote memory storage device 350.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A computer readable medium having computer executable instructions for performing a method comprising:
    generating a first set of parameters associated with a non-selected objective and a second set of parameters associated with a selected objective, the first and second set of parameters being based on a value set;
    generating costs for the value set at a first cost range based on the first set of parameters if the first set of parameters do not meet constraints associated with the non-selected objective;
    generating costs for the value set at a second cost range based on the second set of parameters if the first set of parameters do meet constraints associated with the non-selected objective, the first cost range being substantially higher than the second cost range; and
    repeating generating costs, storing value sets, and value set variations and executing a genetic algorithm, until a desirable value set variation is determined to have an acceptable cost within the second cost range based on the selected objective.

2. The computer readable medium having computer executable instructions for performing the method of claim 1, further comprising:
    storing value sets and associated costs as chromosomes in a chromosome pool, each value set having an associated cost that is either in the first cost range or the second cost range;
    executing a genetic algorithm on the stored value sets to generate value set variations based on chromosomes in the chromosome pool with lower costs;
    generating costs for the value set variations at the first cost range based on the first set of parameters if the first set of parameters do not meet constraints associated with the non-selected objective;
    generating costs for the value set variations at a second cost range based on the second set of parameters if the first set of parameters do meet constraints associated with the non-selected objective; and
    storing value set variations and associated costs as chromosomes in a chromosome pool, each value set variation having an associated cost that is either in the first cost range or the second cost range.

3. The computer readable medium having computer executable instructions for performing the method of claim 1, the value set and value set variations corresponding to different circuit design configurations.

4. The computer readable medium having computer executable instructions for performing the method of claim 3, the constraints associated with the non-selected objective being timing constraints and the selected objective being power.

5. The computer readable medium having computer executable instructions for performing the method of claim 1, further comprising generating a third set of parameters associated with at least one additional non-selected objective, and generating costs at a third cost range based on the third set of parameters if the third set of parameters do not meet constraints associated with the at least one additional non-selected objective, the third cost range being substantially greater than the first cost range and being one of substantially greater than the second cost range and substantially less than the second cost range.

6. The computer readable medium having computer executable instructions for performing the method of claim 1, wherein the non-selected objective is slack constraints associated with a circuit design configuration and the selected objective is power constraints associated with the circuit design configuration.

7. The computer readable medium having computer executable instructions for performing the method of claim 6, further comprising evaluating the costs for at least one cell block based on a slack cost function that provides costs at the first cost range if timing parameters do not meet slack constraints and evaluating the costs for the at least one cell block based on a power function that provides cost at the second cost range if the timing parameters do not meet slack constraints.

8. The computer readable medium having computer executable instructions for performing the method of claim 7, wherein the slack cost function is based on evaluating the following equation:

$$\text{Cost} = M + C^*(\text{Slack}_{Actual} - \text{Slack}_{Max})$$

where M and C are constants substantially greater than one, $Slack_{Actual}$ is the actual slack associated with the at least one cell block and $Slack_{Max}$ is the maximum allowable slack associated with the at least one cell block; and the power cost function is based on evaluating the following equation:

Cost=Power where power is equal to the evaluated power of the at least one cell block.

9. The computer readable medium having computer executable instructions for performing the method of claim 8, further comprising:

storing value sets and associated costs that is in one of the first cost range and the second cost range as chromosomes in a chromosome pool;

executing a genetic algorithm on the stored value sets to generate value set variations based on selecting parent chromosomes in the chromosome pool with lower costs, the genetic algorithm selecting value sets and value set variations from the first cost range if $Slack_{Actual} > Slack_{Max}$ and selecting at least one value set and value set variation from the second cost range upon at least one chromosome having $Slack_{Actual} < Slack_{Max}$;

generating costs for the value set variations at the first cost range based on the first set of parameters if the first set of parameters do not meet constraints associated with the non-selected objective;

generating costs for the value set variations at the second cost range based on the second set of parameters if the first set of parameters do meet constraints associated with the non-selected objective; and storing value set variations and associated costs as chromosomes in a chromosome pool, each value set variation having an associated cost that is in one of the first cost range and the second cost range.

* * * * *